United States Patent
Kyung et al.

(10) Patent No.: US 9,049,778 B2
(45) Date of Patent: Jun. 2, 2015

(54) POLYAMIC ACID, PHOTOSENSITIVE RESIN COMPOSITION, DRY FILM AND CIRCUIT BOARD

(75) Inventors: You-Jin Kyung, Daejeon (KR);
Hee-Jung Kim, Daejeon (KR);
Kwang-Joo Lee, Daejeon (KR);
Jung-Hak Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 14/006,062

(22) PCT Filed: Mar. 19, 2012

(86) PCT No.: PCT/KR2012/001963
§ 371 (c)(1),
(2), (4) Date: Sep. 18, 2013

(87) PCT Pub. No.: WO2012/128526
PCT Pub. Date: Sep. 27, 2012

(65) Prior Publication Data
US 2014/0011905 A1    Jan. 9, 2014

(30) Foreign Application Priority Data

Mar. 18, 2011 (KR) .......................... 10-2011-0024523
Apr. 22, 2011 (KR) .......................... 10-2011-0038030

(51) Int. Cl.
| | |
|---|---|
| C08J 3/28 | (2006.01) |
| C08F 2/46 | (2006.01) |
| C08G 61/04 | (2006.01) |
| H05K 3/00 | (2006.01) |
| H05K 3/28 | (2006.01) |
| C08G 73/10 | (2006.01) |
| C08L 79/08 | (2006.01) |
| C09D 179/08 | (2006.01) |
| G03F 7/031 | (2006.01) |
| G03F 7/037 | (2006.01) |

(52) U.S. Cl.
CPC .............. *H05K 3/0076* (2013.01); *H05K 3/287* (2013.01); *C08G 73/1046* (2013.01); *C08G 73/105* (2013.01); *C08L 79/08* (2013.01); *C09D 179/08* (2013.01); *G03F 7/031* (2013.01); *G03F 7/037* (2013.01)

(58) Field of Classification Search
USPC ........................................................ 522/164
See application file for complete search history.

(56) References Cited

U.S. PATENT DOCUMENTS

| | | |
|---|---|---|
| 5,512,401 A | 4/1996 | Sacripante et al. |
| 5,552,254 A | 9/1996 | Mychajlowsky et al. |
| 2011/0067907 A1* | 3/2011 | Lee et al. ............. 174/256 |

FOREIGN PATENT DOCUMENTS

| | | |
|---|---|---|
| EP | 1659449 A2 | 5/2006 |
| JP | 02-235962 A | 9/1990 |
| JP | 07-333907 A | 12/1995 |
| JP | 2008-239802   * | 10/2008 |
| JP | 2008-239802 A | 10/2008 |
| KR | 10-1010036 B1 | 1/2011 |
| KR | 10-1021947 B1 | 3/2011 |
| TW | 200844140 A | 11/2008 |
| TW | 201107418 A | 3/2011 |

OTHER PUBLICATIONS

Kato et al, JP 2008-239802 Machine Translation, Oct. 9, 2008.*

* cited by examiner

*Primary Examiner* — Ling Choi
*Assistant Examiner* — Jessica E Whiteley
(74) *Attorney, Agent, or Firm* — Rothwell, Figg, Ernst & Manbeck, P.C.

(57) ABSTRACT

The present invention relates to novel polyamic acid; a photosensitive resin composition satisfying excellent flexibility and low stiffness and exhibiting excellent heat resistance and plating resistance; a dry film obtained from the photosensitive resin composition; and a circuit board including the dry film.

18 Claims, No Drawings

POLYAMIC ACID, PHOTOSENSITIVE RESIN COMPOSITION, DRY FILM AND CIRCUIT BOARD

CROSS REFERENCE TO RELATED APPLICATIONS

This application is a 35 U.S.C. §371 National Phase Entry Application from PCT/KR2012/001963, filed Mar. 19, 2012, and designating the United States, which claims priority under 35 U.S.C. §119 to Korean Patent Application No. 10-2011-0024523 filed Mar. 18, 2011 and to Korean Patent Application No. 10-2011-0038030 filed Apr. 22, 2011, which are incorporated herein in their entireties.

FIELD OF THE INVENTION

The present invention relates to a novel polyamic acid, a photosensitive resin composition, a dry film and a circuit board. More specifically, the present invention relates to a novel polyamic acid, a photosensitive resin composition comprising the polyamic acid, a dry film obtained from the photosensitive resin composition, and a circuit board comprising the dry film.

BACKGROUND OF THE INVENTION

Polyimide and the precursor are actively used for a base film of a printed circuit board, a cover film for a high integrated semiconductor device or a high integrated multilayer wiring board due to excellent durability, heat resistance, flame resistance, mechanical and electrical properties, and the like.

Recently, with thinning and high integration of FPC circuit, photoimageable coverlay/photosolder resist for a circuit board is used to improve fine circuit pattern and location accuracy by photolithography process, and relieve spring back of a bent. To be used as a photosensitive cover film for a circuit board, excellent durability, heat resistance, chemical resistance, plating resistance, mechanical and electrical properties are required.

In general, the photosensitive cover film for a circuit board is manufactured by heat pressing a liquid or film shaped photosensitive resin composition on a CCL (Copper Clad Laminate) circuit, exposing to UV according to patterns, developing with a developer, washing and drying, and heat curing, and fine holes required to connect the circuit to a desired location may be accurately made.

As the photosensitive protection film for a circuit board, a photosensitive resin composition that is prepared by adding acrylate, and the like to an epoxy resin used in the existing dry film is used. However, in this case, due to insufficient flame resistance and soldering heat resistance, resin may be discolored during soldering, or separated from the circuit, and due to insufficient flexibility and bending resistance, it cannot be applied for a part requiring repeated folding, and thus, it is limited for application as a photosensitive protection film for a circuit board.

Therefore, to overcome these problems, there is a need for a polyimide photosensitive resin having high heat resistance, bending resistance, and dielectric property, and being applicable for a protection film for the existing circuit pattern.

However, despite the necessity, there are several technical obstacles to use as a material for a polyimide photosensitive circuit protection film. Specifically, if polyimide is used as a photosensitive resin, it is used in the form of polyamic acid, which is a polyimide precursor favorable for moulding, and in this case, high temperature of 350° C. or more is required for polyimidation of polyamic acid.

In a PCB (Printed Circuit Board) process, the operation is progressed while coating or conjugating a protection film on a copper circuit having a pattern, and considering oxidation and deterioration of copper circuit, a process temperature maintains 200° C. or less. Thereby, since polyamic acid requiring a high temperature curing process of 350° C. or more has a limitation for application in the PCB process, a method for lowering a temperature of the polyamic acid curing process is required, and a lot of methods for lowering the curing temperature have been suggested in various literatures.

To lower a curing temperature, a polyamic acid precursor of thermoplastic polyimide having relatively low glass transition temperature (Tg) is used, or soluble polyimide that is already imidated is used.

However, in case where soluble polyimide is used, since imide itself is dissolved in a solvent, chemical resistance is insufficient and electroless gold plating property is not good, and in case where thermoplastic polyimide is used or siloxane is used, due to abnormal glass transition temperature (Tg), coefficient of thermal expansion rapidly increases and problems in terms of building stability and heat resistance was confirmed. If crosslinking density is increased in order to overcome these problems, low stiffness, which is the advantage of a photosensitive coverlay compared to a common coverlay, cannot be satisfied.

DETAILED DESCRIPTION OF THE INVENTION

Technical Objectives

The present invention provides novel polyamic acid.

Further, the present invention provides a photosensitive resin composition that may provide photosensitive material satisfying excellent flexibility and low stiffness and exhibiting excellent heat resistance and plating resistance.

The present invention also provides a dry film obtained from the photosensitive resin composition.

Further, the present invention provides a circuit board comprising the dry film.

Technical Solutions

The present invention provides polyamic acid comprising a repeat unit of the following Chemical Formula 1:

[Chemical Formula 1]

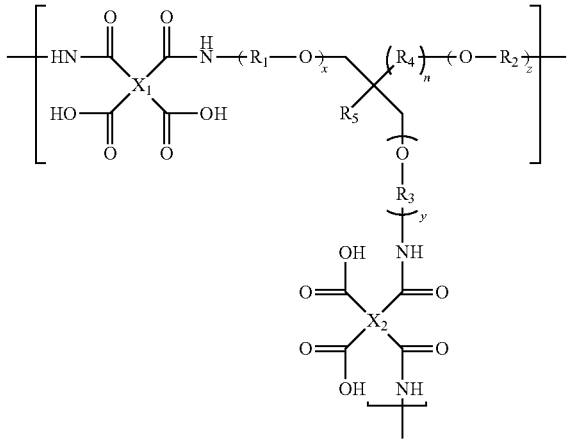

In the Chemical Formula 1, $X_1$ and $X_2$ may be identical or different, and independently a tetravalent organic group, $R_1$, $R_2$, $R_3$ and $R_4$ may be identical or different, and independently a C1-10 linear or branched alkylene group, $R_5$ is a C1-10 linear or branched alkyl group, x, y and z are independently an integer greater than or equal to 1, and n is an integer greater than or equal to 0.

The present invention also provides a photosensitive resin composition comprising a polymer resin comprising the above polyamic acid; a crosslinking agent; an organic solvent; and a photopolymerization initiator.

The present invention also provides a dry film comprising a cured product of the photosensitive resin composition.

The present invention also provides a circuit board comprising the dry film.

Hereinafter, polyamic acid, a photosensitive resin composition, a dry film and a circuit board according to specific embodiments of the invention will be explained in detail.

According to one embodiment of the invention, there is provided polyamic acid comprising a repeat unit of the Chemical Formula 1.

The inventors newly synthesized polyamic acid comprising a repeat unit of the Chemical Formula 1 by reacting specific multifunctional aromatic amine and tetracarboxylic acid dianhydride. As will be explained regarding a photosensitive resin composition, if a photosensitive resin composition using polyamic acid comprising a repeat unit of the Chemical Formula 1 is used, photosensitive material satisfying excellent flexibility and low stiffness and exhibiting excellent heat resistance and plating resistance may be provided.

In the Chemical Formula 1, $R_1$, $R_2$, $R_3$ and $R_4$ may be identical or different, and independently a C1-10 linear or branched alkylene group, $R_5$ is a C1-10 linear or branched alkyl group, x, y and z are independently an integer greater than or equal to 1, and n is an integer greater than or equal to 0. Preferably, $R_1$, $R_2$, $R_3$ and $R_4$ may be independently a methylene group, an ethylene group, an n-propylene group, an iso-propylene group, an n-butylene group, an iso-butylene group, an n-pentylene group, an iso-pentylene group or a neo-pentylene group, x, y and z are independently integer of from 1 to 30, preferably 1 to 10, and n is an integer of from 0 to 30, preferably 0 to 10.

As used herein, an 'alkylene group' represents a divalent functional group derived from alkane, and an 'alkenylene group' represents a divalent functional group derived from alkene.

More preferably, the novel polyamic acid may comprise a repeat unit of the following Chemical Formula 2.

[Chemical Formula 2]

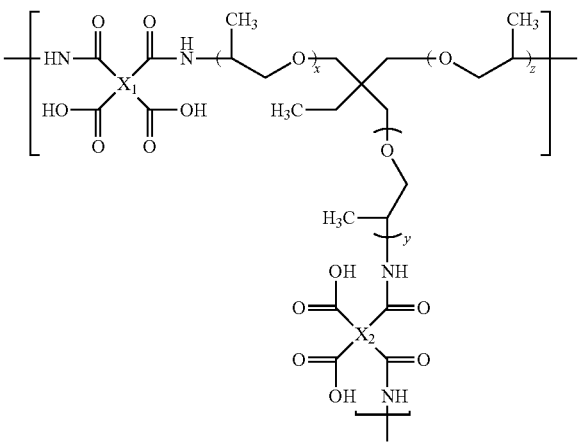

In the Chemical Formula 2, $X_1$ and $X_2$ may be identical or different, and are independently a tetravalent organic group, and x, y and z are independently an integer of from 1 to 30, preferably 1 to 10, more preferably 1 to 5.

Meanwhile, in the Chemical Formula 1 or 2, $X_1$ and $X_2$ may be identical or different, and preferably, are independently a tetravalent organic group selected from the group consisting of the following Chemical Formulae 11 to 24, but the kinds of tetravalent organic groups that can be used are not specifically limited:

[Chemical Formula 11]

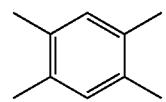

[Chemical Formula 12]

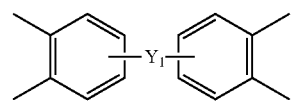

In the Chemical Formula 12, $Y_1$ is a single bond, —O—, —CO—, —S—, —$SO_2$—, —$C(CH_3)_2$—, —$C(CF_3)_2$—, —CONH—, —COO—, —$(CH_2)_{n1}$—, —$O(CH_2)_{n2}O$—, or —$COO(CH_2)_{n3}OCO$—, and n1, n2 and n3 are independently an integer of from 1 to 10,

[Chemical Formula 13]

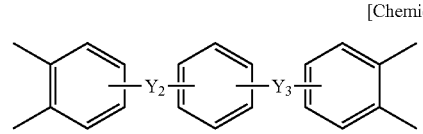

in the Chemical Formula 13, $Y_2$ and $Y_3$ may be identical or different, and are independently a single bond, —O—, —CO—, —S—, —$SO_2$—, —$C(CH_3)_2$—, —$C(CF_3)_2$—, —CONH—, —COO—, —$(CH_2)_{n1}$—, —$O(CH_2)_{n2}O$—, or —$COO(CH_2)_{n3}OCO$—, and n1, n2 and n3 are independently an integer of from 1 to 10,

[Chemical Formula 14]

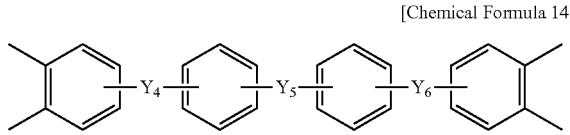

in the Chemical Formula 14, $Y_4$, $Y_5$ and $Y_6$ may be identical or different, and independently a single bond, —O—, —CO—, —S—, —SO$_2$—, —C(CH$_3$)$_2$—, —C(CF$_3$)$_2$—, —CONH—, —COO—, —(CH$_2$)$_{n1}$—, —O(CH$_2$)$_{n2}$O—, or —COO(CH$_2$)$_{n3}$OCO—, and n1, n2 and n3 are independently an integer of from 1 to 10,

[Chemical Formula 15]

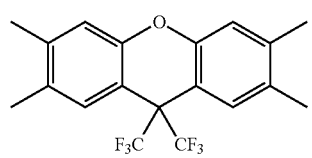

[Chemical Formula 16]

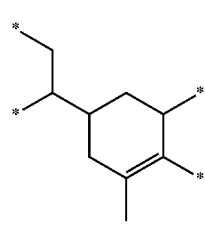

[Chemical Formula 17]

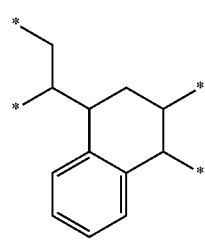

In the Chemical Formula 16 and 17, * is a bonding point.

[Chemical Formula 18]

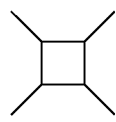

[Chemical Formula 19]

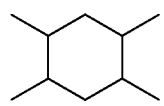

[Chemical Formula 20]

[Chemical Formula 21]

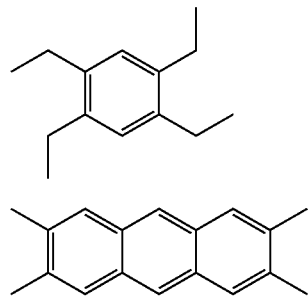

[Chemical Formula 22]

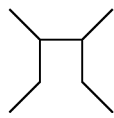

[Chemical Formula 23]

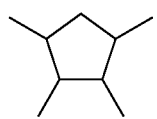

[Chemical Formula 24]

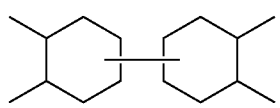

[Chemical Formula 25]

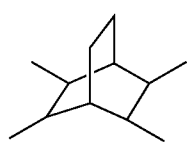

Meanwhile, the polyamic acid may further comprise a repeat unit of the following Chemical Formula 8, in addition to the repeat unit of the Chemical Formula 1 or Chemical Formula 2.

[Chemical Formula 8]

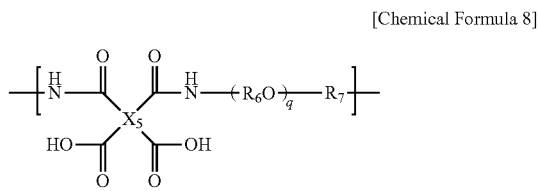

In the Chemical Formula 8, $X_5$ is a tetravalent organic group, $R_6$ and $R_7$ may be identical or different and are independently a C1-10 linear or branched alkylene group, and q is an integer greater than o equal to 1.

Although the tetravalent organic group that can be applied for $X_5$ is not specifically limited, it may be preferably selected from a group consisting of the Chemical Formulae 11 to 24.

If the polyamic acid further comprises a repeat unit of the Chemical Formula 8, i.e., a repeat unit derived from alkylene oxide diamine, compatibility with ingredients such as a photocrosslinking agent, and the like may be further improved, and a dry film prepared using the polyamic acid may have improved bending property and curl property, and the like.

And, the polyamic acid may further comprise a common repeat unit of polyamic acid, for example, a repeat unit of the following Chemical Formula 3, in addition to the repeat unit of the Chemical Formula 1 or Chemical Formula 2 and the repeat unit of the Chemical Formula 8.

[Chemical Formula 3]

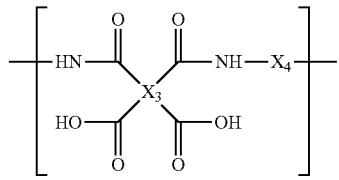

In the Chemical Formula 3, $X_3$ is a tetravalent organic group, and $X_4$ is a divalent organic group. Although the tetravalent organic group that can be applied for $X_3$ is not specifically limited, it may be preferably selected from a group consisting of the Chemical Formulae 11 to 24. And, the repeat unit of the Chemical Formula 3 may preferably have a structure or property wherein the glass transition temperature may become 250° C. or less when polyamic acid comprising the same is polyimidized, in terms of compatibility with a photocrosslinking agent.

And, although the divalent organic group that can be used as $X_4$ is not specifically limited, it may be preferably selected from the group consisting of the following Chemical Formula 30 to Chemical Formula 47.

[Chemical Formula 30]

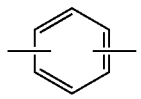

[Chemical Formula 31]

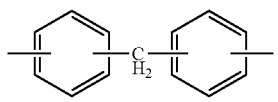

[Chemical Formula 32]

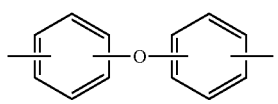

[Chemical Formula 33]

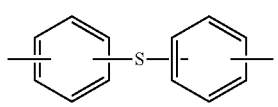

[Chemical Formula 34]

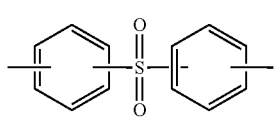

[Chemical Formula 35]

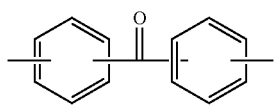

[Chemical Formula 36]

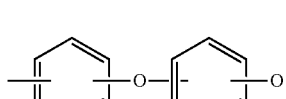

[Chemical Formula 37]

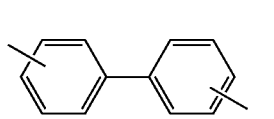

[Chemical Formula 38]

[Chemical Formula 39]

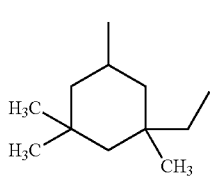

[Chemical Formula 40]

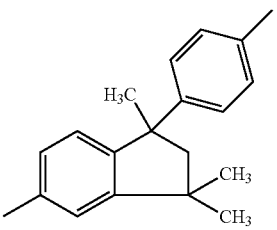

[Chemical Formula 41]

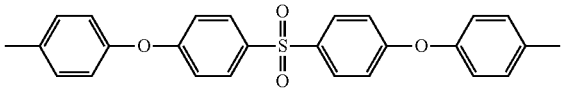

[Chemical Formula 42]

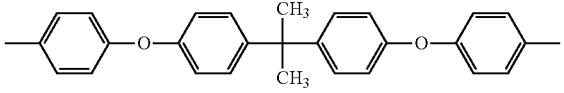

[Chemical Formula 43]

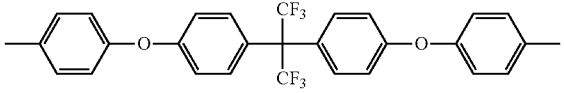

[Chemical Formula 44]

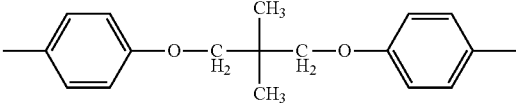

[Chemical Formula 45]

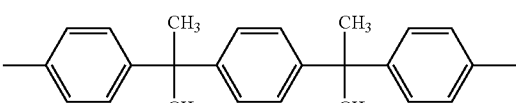

[Chemical Formula 46]

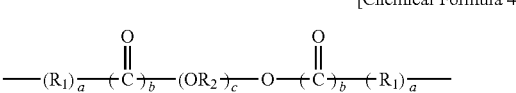

In the Chemical Formula 46, $R_1$ is C2-8 alkylene or arylene, $R_2$ is C2-8 alkylene, a and b are independently 0 or 1, and c is an integer of from 1 to 21,

[Chemical Formula 47]

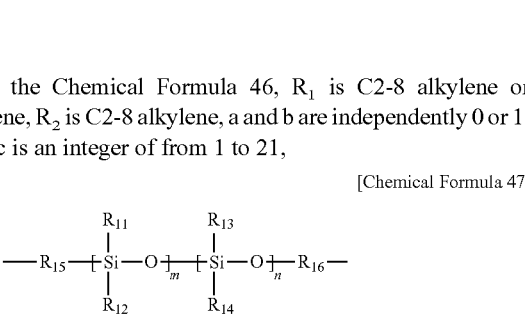

In the Chemical Formula 47, $R_{11}$, $R_{12}$, $R_{13}$ and $R_{14}$ may be identical or different, and are independently a C1-5 alkyl group or a C6-10 aryl group, $R_{15}$ and $R_{16}$ are independently a C1-20 linear or branched alkylene group, m is an integer greater than or equal to 1, and n is an integer greater than or equal to 0.

[Chemical Formula 48]

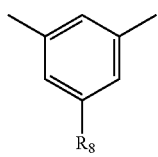

In the Chemical Formula 48, $R_8$ is one of the functional groups of the following Chemical Formula 48-1.

[Chemical Formula 48-1]

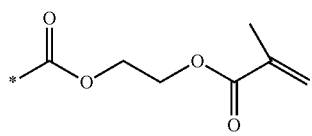

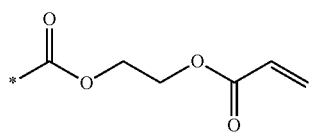

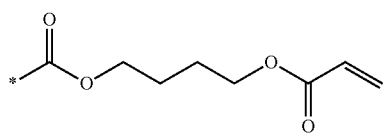

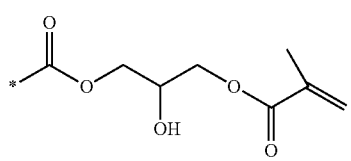

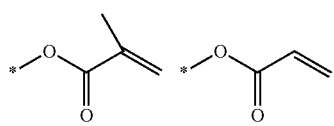

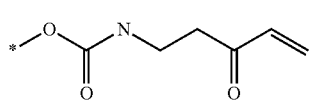

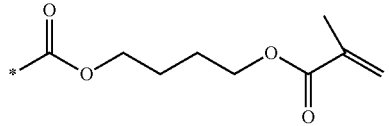

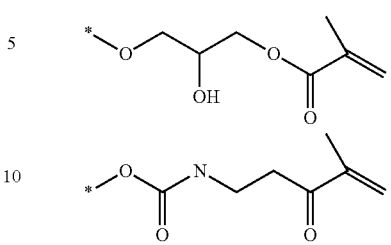

[Chemical Formula 49]

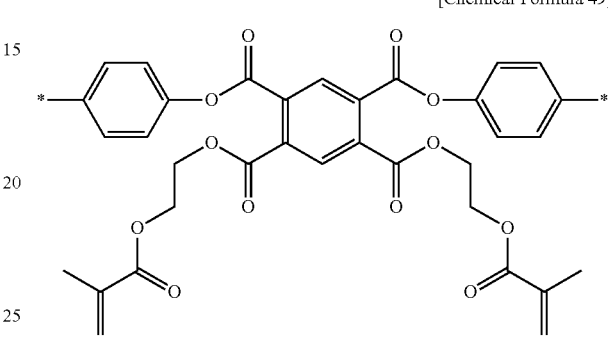

In the Chemical Formulae 48 and 49, * represents a bonding point.

Meanwhile, the polyamic acid may comprise 0.1 to 30 mol % of the repeat unit of the Chemical Formula 1; 2 to 50 mol % of the repeat unit of the Chemical Formula 8; and 20 to 97.9 mol % of the repeat unit of the Chemical Formula 3. Preferably, the polyamic acid may comprise 0.3 to 20 mol % of the repeat unit of the Chemical Formula 1; 3 to 30 mol % of the repeat unit of the Chemical Formula 8; and 50 to 96.7 mol % of the repeat unit of the Chemical Formula 3. If the content of the repeat unit of the Chemical Formula 1 is too low, crosslinking density of the photosensitive material obtained using the polyamic acid may be too low and improvement in heat resistance may not be expected, and if the content is too high, molecular weight of polyamic acid may be largely increased to cause rapid increase in viscosity, thus deteriorating workability and physical properties, developing property, flexibility and stiffness property.

If the content of the repeat unit of the Chemical Formula 8 is too low, bending property, stiffness property and curl property may be deteriorated, and if the content is too high, heat resistance and ion migration property may be deteriorated.

Meanwhile, the polyamic acid may have weight average molecular weight of 5,000 to 200,000, preferably 8,000 to 50,000. If the molecular weight of polyamic acid is too small, the function of the photosensitive resin composition as a base resin may not be property achieved, and if the molecular weight of polyamic acid is too large, compatibility with other materials included in the photosensitive resin composition may be deteriorated.

Meanwhile, polyamic acid comprising the repeat unit of the Chemical Formula 1 may be prepared by a common organic synthesis method known in the art. For example, the polyamic acid may be prepared by dissolving a multifunctional aromatic amine compound of the following Chemical Formula 4 and optionally a diamine compound of the Chemical Formula 5 in a solvent, and adding tetracarboxylic acid dianhydride to react them.

[Chemical Formula 4]

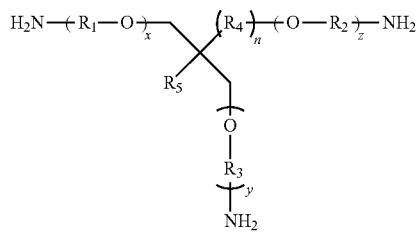

In the Chemical Formula 4, $R_1$, $R_2$, $R_3$ and $R_4$ may be identical or different, and independently a C1-10 linear or branched alkylene group, $R_5$ is a C1-10 linear or branched alkyl group, x, y and z are independently an integer greater than or equal to 1, and n is an integer greater than or equal to 0. Preferably, $R_1$, $R_2$, $R_3$ and $R_4$ are independently a methylene group, an ethylene group, an n-propylene group, an iso-propylene group, an n-butylene group, an iso-butylene group, an n-pentylene group, an iso-pentylene group or a neo-pentylene group, x, y and z are independently an integer of from 1 to 30, preferably an integer of from 1 to 10, and n is an integer of from 0 to 30.

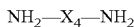   [Chemical Formula 5]

In the Chemical Formula 5, $X_4$ is a divalent organic group, the divalent organic group that can be used is not specifically limited, and the specific examples are as explained above.

Specific example of the diamine compound of the Chemical Formula 5 may include p-PDA (p-phenylenediamine), m-PDA (m-phenylenediamine), 4,4'-ODA (4,4'-oxydianiline), 3,4'-ODA (3,4'-oxydianiline), BAPP (2,2-bis(4-[4-aminophenoxy]-phenyl)propane), APB-N (1,3-bis(3-aminophenoxy)benzene), TPE-R (1,3-bis(4-aminophenoxy)benzene), TPE-Q (1,4-bis(4-aminophenoxy)benzene), and m-BAPS (2,2-bis(4-[3-aminophenoxy]phenyl)sulfone), and the like, but not limited thereto.

As the tetracarboxylic acid dianhydride, a compound of the following Chemical Formula 6 may be used.

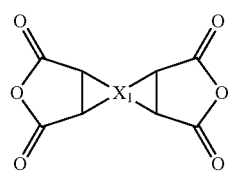   [Chemical Formula 6]

In the Chemical Formula 6, $X_1$ is a tetravalent organic group, and although the tetravalent organic group that can be used is not specifically limited, it may be preferably selected from a group consisting of the Chemical Formulae 11 to 24. Further details are as explained above.

Specific example of the tetracarboxylic acid dianhydride may include pyromellitic dianhydride, 3,3',4,4'-biphenyltetracarboxylic dianhydride, 3,3',4,4'-benzophenonetetracarboxylic dianhydride, 4,4'-oxydiphthalic anhydride, 4,4'-(4,4'-isopropylbiphenoxy)biphthalic anhydride, 2,2'-bis-(3,4-dicarboxylphenyl)hexafluoropropane dianhydride, TMEG (ethyleneglycol bis(anhydro-trimellitate), and a combination thereof, but not limited thereto.

Meanwhile, to synthesize polyamic acid further comprising the repeat unit of the Chemical Formula 8, the above explained multifunctional aromatic amine compound of the Chemical Formula 4 and optionally a diamine compound of the Chemical Formula 5 are dissolved in a solvent together with a diamine compound of the following Chemical Formula 9, and tetracarboxylic acid dianhydride is added to react them.

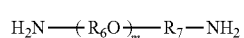   [Chemical Formula 9]

In the Chemical Formula 9, $R_6$, $R_7$ may be identical or different, and are independently a C1-10 linear or branched alkylene group, and m is an integer greater than or equal to 1.

Specific examples of the diamine compound of the Chemical Formula 9 may include ethylene oxide diamine, propylene oxide diamine, ethyleneoxide-propyleneoxide diamine, and the like, and D-230, D-400, D-2000, D-4000, EDR-148, EDR-176, HK-511, ED-600, ED-900, ED-2003, and the like (Huntsman Corporation).

The reaction between the multifunctional aromatic amine compound of the Chemical Formula 4, a diamine compound of the Chemical Formula 5 or 9, and tetracarboxylic acid dianhydride may be preferably started at a temperature of from 0 to 5° C., and conducted for about 24 hours until the reaction completes at a temperature of from 10 to 40° C. The mole ratio of the sum of the multifunctional aromatic amine compound and diamine compound:tetracarboxylic acid dianhydride is preferably 1:0.9 to 1:1.1. If the mole ratio of the sum of the multifunctional aromatic amine compound and diamine compound is less than 0.9 or greater than 1.1, the molecular weight of the prepared polyamic acid may not fall within an appropriate range, and thus, the obtained polyamic acid or polyimide may have deteriorated mechanical properties, and the like.

The solvent used in the preparation of polyamic acid may include N-methylpyrrolidinone (NMP), N,N-dimethylacetamide (DMAc), tetrahydrofuran (THF), N,N-dimethylformamide (DMF), dimethylsulfoxide (DMSO), cyclohexane, acetonitrile, and a combination thereof, but not limited thereto.

Meanwhile, according to another embodiment of the invention, there is provided a photosensitive resin composition comprising a polymer resin comprising the novel polyamic acid; a photocrosslinking agent; an organic solvent; and a photopolymerization initiator.

The inventors confirmed through experiments that if a photosensitive resin composition using novel polyamic acid comprising a repeat unit of the Chemical Formula 1 is used, photosensitive material satisfying excellent flexibility and low stiffness property and excellent mechanical properties including heat resistance and plating resistance, and the like and high developing property may be provided, and completed the invention.

The details of the novel polyamic acid comprising the repeat unit of the Chemical Formula 1 are as explained above. And, the details of the polyamic acid further comprising the repeat unit of the Chemical Formula 3 or Chemical Formula 8 are as explained above.

The photocrosslinking agent may include those commonly used for a photosensitive resin composition without specific limitations, but a (meth)acrylate based compound including a double bond between carbons may be preferably used. As used herein, (meth)acrylate means acrylate or methacrylate, unless otherwise defined.

The (meth)acrylate based compound including a double bond between carbons exhibits high compatibility with polyamic acid, and when included in a photosensitive resin composition, it may embody high developing property and excellent photosensitivity to an alkaline solution. And, when a photosensitive resin composition using the (meth)acrylate based compound including a double bond between carbons is processed into a dry film, modulus decreases at heat processing, and flowability is provided at thermal lamination to improve pattern filling property, and thereby, enabling a thermal lamination process even at comparatively low temperature.

The (meth)acrylate based compound including a double bond between carbons, which can be used as the photocrosslinking agent, is not specifically limited, and specific examples thereof may include 2-ethylhexyl(meth)acrylate, 2-hydroxyethyl(meth)acrylate, 2-hydroxypropyl(meth)acrylate, phenoxyethyl acrylate, stearylacrylate, laurylacrylate, glycidyl(meth)acrylate, triethyleneglycoldiacrylate, 1,3-butandiol diacrylate, diethyleneglycol diacrylate, neopentylglycol diacrylate, 1,6-hexanediol diacrylate, 3-methyl-1, 5-pentanediol diacrylate, 2-butyl-2-ethyl-1,3-propanediol acrylate, 1,9-nonanediol diacrylate, 1,6-hexanediol epoxy acrylate, pentaerythritol(meth)acrylate, trimethyolpropanetri (meth)acrylate, tris(hydroxyethyl(meth)acryloyl)isocyanurate, polyesteracrylate, urethane acrylate, pentaerythritoltetra (meth)acrylate, and the like, and a combination thereof.

In terms of flexibility or bending property of the photosensitive resin composition or product obtained therefrom, the photocrosslinking agent may preferably include a compound of the following Chemical Formula 7 in part.

[Chemical Formula 7]

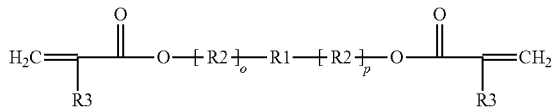

In the Chemical Formula 7, R1 is an aromatic group having two or more benzene rings in the molecule, R2 is an ethyleneoxide or propyleneoxide group, R3 is hydrogen or a methyl group, o and p are integer greater than or equal to 2, and o+p is an integer less than or equal to 50, preferably less than or equal to 30.

Examples of the compound of the Chemical Formula 7 may include NK Ester Series A-BPE-10, A-BPE 20, A-BPE-30, BPE-500, BPE-900 (NK Ester), bisphenol A EO modified meth(acrylate), bisphenol F EO modified meth(acrylate), PO modified meth(acrylate), manufactured by Shin Nakamura Chemical Co., Ltd. or Kyoeisha Chemical Co., Ltd., and SR-480, SR-602, CD-542, manufactured by Sartomer Co. Inc., and the like, and specific examples may include ethyleneoxide modified bisphenol A di(meth)acrylate, propyleneoxide modified bisphenol A di(meth)acrylate, ethyleneoxide-propyleneoxide modified bisphenol A di(meth)acrylate, ethyleneoxide modified bisphenol F di(meth)acrylate, propyleneoxide modified bisphenol F di(meth)acrylate, ethyleneoxide-propyleneoxide modified bisphenol F di(meth) acrylate, and the like.

Meanwhile, the photocrosslinking agent may include an acetophenone based compound, a biimidazole based compound, a triazine based compound, an oxime based compound, and a combination thereof.

Specific examples of the photopolymerization initiator may include an acetophenone based compound such as 2-hydroxy-2-methyl-1-phenylpropan-1-one, 1-(4-isopropylphenyl)-2-hydroxy-2-methylpropan-1-one, 4-(2-hydroxyethoxy)-phenyl-(2-hydroxy-2-propyl)ketone, 1-hydroxycyclohexylphenylketone, benzoinmethyl ether, benzoinethyl ether, benzoinisobutyl ether, benzoinbutyl ether, 2,2-dimethoxy-2-phenylacetophenone, 2-methyl-(4-methylthio)phenyl-2-morpholino-1-propan-1-one, 2-benzyl-2-dimethylamino-1-(4-morpholinophenyl)-butan-1-one, or 2-methyl-1-[4-(methylthio)phenyl]-2-morpholinopropan-1-one, and the like;

a biimidazole based compound such as 2,2-bis(2-chlorophenyl)-4,4',5,5'-tetraphenyl biimidazole, 2,2'-bis(o-chlorophenyl)-4,4',5,5'-tetrakis(3,4,5-trimethoxyphenyl)-1,2'-biimidazole, 2,2'-bis(2,3-dichlorophenyl)-4,4',5,5'-tetraphenyl biimidazole, or 2,2'-bis(o-chlorophenyl)-4,4,5,5'-tetraphenyl-1,2'-biimidazole, and the like;

a triazine based compound such as 3-{4-[2,4-bis(trichloromethyl)-s-triazin-6-yl]phenylthio}propionic acid, 1,1,1,3,3,3-hexafluoroisopropyl-3-{4-[2,4-bis(trichloromethyl)-s-triazin-6-yl]phenylthio}propionate, ethyl-2-{4-[2,4-bis (trichloromethyl)-s-triazin-6-yl]phenylthio}acetate, 2-epoxyethyl-2-{4-[2,4-bis(trichloromethyl)-s-triazin-6-yl] phenylthio}acetate, cyclohexyl-2-{4-[2,4-bis(trichloromethyl)-s-triazin-6-yl]phenylthio}acetate, benzyl-2-{4-[2,4-bis(trichloromethyl)-s-triazin-6-yl]phenylthio}acetate, 3-{chloro-4-[2,4-bis(trichloromethyl)-s-triazin-6-yl] phenylthio}propionic acid, 3-{4-[2,4-bistrichloromethyl)-s-triazin-6-yl]phenylthio}propionamide, 2,4-bis(trichloromethyl)-6-p-methoxystyryl-s-triazine, 2,4-bis (trichloromethyl)-6-(1-p-dimethylaminophenyl)-1,3,-butadienyl-s-triazine, or 2-trichloromethyl-4-amino-6-p-methoxystyryl-s-triazine, and the like; and an oxime based compound such as CGI-242, CGI-124, and the like (Japan Shiba Co. Ltd), and the like.

The photosensitive resin composition may include an organic solvent to dissolve the photosensitive resin composition and provide viscosity suitable for coating the composition. The organic solvent may include those commonly used in a photosensitive resin composition without specific limitations, and specific examples thereof may include ketones such as methylethylketone, cyclohexanone, and the like; aromatic hydrocarbons such as toluene, xylene, tetramethylbenzene, and the like; glycolethers (cellosolve) such as ethyleneglycolmonoethylether, ethyleneglycolmonomethylether, ethyleneglycolmonobutylether, diethyleneglycolmonoethylether, diethyleneglycolmonomethylether, diethyleneglycolmonobutylether, propyleneglycolmonomethylether, propyleneglycolmonoethylether, dipropyleneglycolmonodiethylether, triethyleneglycolmonoethylether, and the like; acetic esters such as ethyl acetate, butyl acetate, ethylenegylcolmonoethylether acetate, ethyleneglycolmonobutylether acetate, diethyleneglycol monoethylether acetate, dipropyleneglycol monomethylether acetate, and the like; alcohols such as ethanol, propanol, ethyleneglycol, propyleneglycol, carbitol, and the like; aliphatic hydrocarbons such as octane, decane, and the like; a petroleum based solvent such as petroleum ether, petroleum naphtha, hydrogenated petroleum naphtha, solvent naphtha, and the like; amides such as dimethylacetamide (DMAc), dimethylformamide (DMF), and the like, and a combination thereof.

Solid concentration of the polymer resin comprising the polyamic acid may be appropriately selected considering the molecular weight, viscosity, volatility, and the like of the polyamic acid comprising the repeat unit of the Chemical Formula 1, and the properties of the final product, for example, a dry film, and the like. Preferably, the solid concentration of the polymer resin comprising the polyamic acid may be 20 to 90 wt %, based on the total weight of the photosensitive resin composition.

Meanwhile, the photosensitive resin composition may comprise, based on 100 parts by weight of the polymer resin composition, 5 to 300 parts by weight of the crosslinking agent; 100 to 700 parts by weight of the organic solvent; and 0.3 to 10 parts by weight of the photopolymerization initiator.

If the content of the crosslinking agent is too low, developing property of the photosensitive resin may be lowered, and if the content is too high, properties such as heat resistance or plating resistance, and the like may be lowered.

If the content of the photopolymerization initiator is too low, the degree of photocuring of the crosslinking agent or the polymer resin comprising the polyamic acid comprising the repeat unit of the Chemical Formula 1 may be lowered, and if the content is too high, radicals that do not participate in the curing may deteriorate properties of the final product, for example, a dry film.

If the content of the organic solvent is too low, viscosity of the photosensitive resin composition is too high and coatability may be deteriorated, and if the content is too high, drying of the photosensitive resin composition may not be easy, and mechanical properties of the manufactured film may be deteriorated.

Meanwhile, the photosensitive resin composition may further comprise a thermal crosslinking agent, a curing accelerator, a photocrosslinking sensitizer, a phosphorus flame retardant, an antifoaming agent, a leveling agent, and an antigelling agent, and a mixture thereof. The additives may include those known to be usable in a photosensitive resin composition without specific limitations, and they may be used in an appropriate amount considering properties of the film obtained therefrom.

Meanwhile, according to yet another embodiment of the invention, there is provided a dry film comprising a cured product of the photosensitive resin composition.

As explained above, if a photosensitive resin composition using polyamic acid comprising the repeat unit of the Chemical Formula 1 is used, photosensitive material satisfying excellent flexibility and low stiffness and exhibiting excellent heat resistance and plating resistance may be provided.

The dry film may be prepared by coating a photosensitive resin composition on a substrate and drying by a known method. The substrate may be preferably those capable of delaminating a photosensitive resin composition layer and having good light transmittance. And, it may preferably have surface smoothness.

Specific examples of the substrate may include various plastic films such as polyethyleneterephthalate, polyethylenenaphthalate, polypropylene, polyethylene, cellulose triacetate, cellulose diacetate, poly(meth)acrylic acid alkyl ester, poly(meth)acrylic acid ester copolymer, polyvinylchloride, polyvinylalcohol, polycarbonate, polystyrene, cellophane, polyvinylidenechloride copolymer, polyamide, polyimide, vinyl chloride vinyl acetate copolymer, polytetrafluoroethylene, and polytrifluoroethylene, and the like. And, composite material consisting of two or more kinds thereof may be used, and polyethyleneterephthalate film having excellent light transmittance is particularly preferable. The substrate may preferably have a thickness of 5 to 150 μm, more preferably 10 to 50 μm.

The photosensitive resin composition may be coated by spray, roll coating, rotation coating, slit coating, extrusion coating, curtain coating, die coating, wire bar coating or knife coating, and the like, without specific limitations. Drying of the photosensitive resin composition may be preferably conducted at 60 to 100° C. for 30 seconds to 15 minutes, although varied according to the kinds of each composition ingredient and organic solvent, and the composition ratio.

After drying and curing, the dry film may have a film thickness of 5 to 95 μm, more preferably 10 to 50 μm. If the thickness of the dry film is less than 5 μm, insulation is not good, and if it is greater than 95 μm, resolution may be deteriorated.

The dry film may be used for a protection film for a circuit board, a base film for a circuit board, an insulating layer of a circuit board, a semiconductor interlayer dielectric, or a solder resist.

Meanwhile, according to yet another embodiment of the invention, there is provided a circuit board comprising the dry film.

The circuit board may include a multi-layer printed-circuit board, a flexible circuit board, or a ductile circuit board. As explained above, the dry film may be used in the circuit board as a protection film for a circuit board, a base film for a circuit board, an insulating layer of a circuit board, a semiconductor interlayer dielectric, or a solder resist, and the like.

The dry film included in the circuit board includes a dry film or a processed product of a dry film, for example, a processed product laminated on a specific substrate or a photoreaction product, and the like.

The dry film may be pre-laminated on a circuit forming side at a temperature of 20 to 50° C. by flat pressing or roll pressing, and the like, and then, vacuum laminated at 60 to 90° C. to form a photosensitive film.

And, the dry film may be exposed to light using a photomask to form a fine construction or fine width line, thereby forming a pattern. The exposure may be appropriately controlled according to the kind of light source used for UV exposure and the thickness of the film, and for example, it may be preferably 100 to 1200 m/cm$^2$, more preferably 100 to 500 m/cm$^2$.

Active ray that can be used may include electron beam, UV, X-ray, and the like, preferably UV. And, light source that can be used may include a high pressure mercury vapor lamp, a low pressure mercury vapor lamp, or a halogen lamp, and the like.

After light exposure, development is generally conducted by spray method, and the photosensitive resin composition is developed using an alkali aqueous solution such as sodium carbonate aqueous solution, and the like, and washed with water. And then, through heat treatment, polyamic acid turns into polyimide according to the pattern obtained by development, wherein the heat treatment temperature may be 100 to 250° C., which is required for imidation. It may be effective that the heating temperature has an appropriate temperature profile and is continuously elevated through 2 to 4 steps, but in some cases, curing may be conducted at a constant temperature. Through the above explained steps, a multi-layer printed-circuit board, a flexible circuit board or a ductile circuit board may be obtained.

Advantageous Effect of the Invention

According to the present invention, there are provided novel polyamic acid; a photosensitive resin composition that may provide photosensitive material satisfying excellent flexibility and low stiffness and exhibiting excellent heat resistance and plating resistance; a dry film obtained from the phososensitive resin composition, and a circuit board comprising the dry film.

DETAILS FOR PRACTICING THE INVENTION

Hereinafter, the present invention will be explained with reference to the following examples. However, these examples are presented only to illustrate the invention, and the scope of the invention is not limited thereto.

Preparation Example

Preparation of Polyamic Acid

Preparation Example 1

Preparation of Polyamic Acid (PAA1)

While flowing nitrogen into a 4-neck round bottom flask equipped with a thermometer, a stirrer, a nitrogen inlet, and a powder dispensing funnel, 700 g of N,N-dimethylformaide (DMF) was added to 140.53 g of 1,3-bis(3-aminophenoxy)benzene (APB-N) and 11.13 g of trifunctional polyetheramine (JEFFAMINE T-403: Huntsman), and they were stirred to completely dissolve. While cooling the solution to 15° C. or less, 72.21 g of 3,3',4,4'-biphenyltetracarboxylic dianhydride (BPDA) and 76.13 g of 4,4'-oxydiphthalic anhydride (ODPA) were slowly added and stirred to obtain polyamic acid varnish.

Preparation Example 2

Preparation of Polyamic Acid (PAA2)

Polyamic acid varnish was obtained by the same method as Preparation Example 1, except that as a diamine compound, 1,3-bis(4-aminophenoxy)benzene (TPE-R) and 6.63 g of trifunctional polyetheramine (JEFFAMINE T-403: Huntsman) were used instead of 140.53 g of 1,3-bis(3-aminophenoxy)benzene (APB-N), and as dianhydride, 151.04 g of 4,4'-oxydiphthalic anhydride (ODPA) was used instead of 72.21 g of 3,3',4,4'-biphenyltetracarboxylic dianhydride (BPDA) and 76.13 g of 4,4'-oxydiphthalic anhydride (ODPA).

Preparation Example 3

Preparation of Polyamic Acid (PAA3)

While flowing nitrogen into a 4-neck round bottom flask equipped with a thermometer, a stirrer, a nitrogen inlet, and a powder dispensing funnel, 149.79 g of 1,3-bis(3-aminophenoxy)benzene (APB-N) and 700 g of N,N-dimethylformamide (DMF) were added, and stirred to completely dissolve. While cooling the solution to 15° C. or less, 73.12 g of 3,3',4,4'-biphenyltetracarboxylic dianhydride (BPDA) and 77.09 g of 4,4'-oxydiphthalic anhydride (ODPA) were slowly added and stirred to obtain polyamic acid varnish.

Preparation Example 4

Preparation of Polyamic Acid (PAA1)

While flowing nitrogen into a 4-neck round bottom flask equipped with a thermometer, a stirrer, a nitrogen inlet, and a powder dispensing funnel, 455 g of N,N-dimethylforamide (DMF) was added to 88.78 g of 1,3-bis(3-aminophenoxy)benzene (APB-N), 31.55 g of alkyleneoxide diamine (JEFFAMINE D-400; Huntsman) and 4.77 g of trifunctional polyetheramine (JEFFAMINE T-403: Huntsman), and they were stirred to completely dissolve. While cooling the solution to 15° C. or less, 119.9 g of 4,4'-oxydiphthalic anhydride (ODPA) was slowly added, and the mixture was stirred to obtain polyamic acid varnish having solid content of 35%.

Preparation Example 5

Preparation of Polyamic Acid (PAA2)

Polyamic acid varnish was obtained by the same method as Preparation Example 4, except that as a diamine compound, 90.56 g of 1,3-bis(3-aminophenoxy)benzene (APB-N), 29.86 of alkyleneoxide diamine (JEFFAMINE D-2000: Huntsman), 9.86 g of 2-methacrylethyl-3,5-diaminobenzoate (HEMA-DA), and 4.51 g of trifunctional polyetheramine (JEFFAMINE T-403: Huntsman) were used, and as dianhydride, 53.47 g of 3,3',4,4'-biphenyltetracarboxylic dianhydride (BPDA) and 56.74 g of 4,4'-oxydiphthalic anhydride (ODPA) were used.

Preparation Example 6

Preparation of Polyamic Acid (PAA3)

As a diamine compound, 55.14 g of 1,3-bis(3-aminophenoxy)benzene (APB-N) and 38.59 g of 1,3-bis(4-aminophenoxy)benzene (TPE-R), as alkyleneoxide diamine, 9.05 g of D-400 and 30.18 g of D-2000, and as trifunctional polyetheramine, 7.60 g of T-403 were used. Polyamic acid varnish was obtained by the same method as Preparation Example 4, except that as dianhydride, 24.17 g of pyromellitic dianhydride (PMDA) and 80.27 of 4,4'-oxydiphthalic anhydride (ODPA) were used.

Preparation Example 7

Preparation of Polylamic Acid (PAA4)

Polyamic acid varnish was obtained by the same method as Preparation Example 4, except that as a diamine compound, 86.56 g of 1,3-bis(3-aminophenoxy)benzene (APB-N) and 33.54 g of 2-methacrylethyl-3,5-diaminobenzoate (HEMA-DA) were used, and as dianhydride, 60.60 g of 3,3',4,4'-biphenyltetracarboxylic dianhydride (BPDA) and 64.30 g of 4,4'-oxydiphthalic anhydride (ODPA) were used.

Preparation Example 8

Preparation of Polyamic Acid (PAA5)

As a diamine compound, 28.65 g of 1,3-bis(3-aminophenoxy)benzene (APB-N) and 101.62 g of alkyleneoxide diamine D-400 were used, and as trifunctional polyetheramine, 4.39 g of T-403 was completely dissolved in 455 g of N,N-dimethylformaide (DMF). While cooling the solution to 15° C. or less, 110.34 g of 4,4'-oxydiphthalic anhydride (ODPA) was slowly added, and the mixture was stirred to obtain polyamic acid varnish having solid content of 35%.

Example and Comparative Example

Preparation of a Photosensitive Composition and a Dry Film using the Same

Example 1

Into 100 parts by weight of the polyamic acid varnish obtained by the method of Preparation Example 1, as a (meth)acrylate compound including a double bond between carbons, 15 parts by weight of A-BPE-20 (Daiichi Chemical) and 15 parts by weight of Kayarad R-128H (Nippon Kayaku), and as a photopolymerization initiator, 1.2 parts by weight of Darocur TPO were introduced and they were mixed to prepare a photosensitive resin composition.

The photosensitive resin composition was coated on a PET film to a thickness of 80 μm using a doctor blade, and then, the coated product was dried in an oven of 80° C. for 10 minutes to manufacture a dry film with a thickness of 38 μm.

Example 2

Into 100 parts by weight of the polyamic acid varnish obtained by the method of Preparation Example 2, as a (meth) acrylate compound including a double bond between carbons, 20 parts by weight of A-BPE-20 (Daiichi Chemical) and 10 parts by weight of EA-1020, and as a photopolymerization initiator, 1.2 parts by weight of Darocur TPO were introduced and they were mixed to prepare a photosensitive resin composition.

The photosensitive resin composition was coated on a PET film to a thickness of 80 μm using a doctor blade, and then, the coated product was dried in an oven of 80° C. for 10 minutes to manufacture a dry film with a thickness of 38 μm.

Example 3

Into 100 parts by weight of the polyamic acid varnish obtained by the method of Preparation Example 4, as a (meth) acrylate compound including a double bond between carbons, 30 parts by weight of Evecryl150 (Cytec) and 13 parts by weight of Ebecryl3708 (Cytec), and as a photopolymerization initiator, 1.2 parts by weight of Darocur TPO were introduced and they were mixed to prepare a photosensitive resin composition.

The photosensitive resin composition was coated on a PET film to a thickness of 80 μm using a doctor blade, and then, the coated product was dried in an oven of 80° C. for 10 minutes to manufacture a dry film with a thickness of 38 μm.

Example 4

Into 100 parts by weight of the polyamic acid varnish obtained by the method of Preparation Example 5, as a (meth) acrylate compound including a double bond between carbons, 25 parts by weight of A-BPE-10 (Shin Nakamura Chemical), 15 parts by weight of Ebecryl3700 (Cytec), and 3 parts by weight of M300 (Miwon commercial Co., Ltd.), and as a photopolymerization initiator, 1.2 parts by weight of Darocur TPO were introduced and they were mixed to prepare a photosensitive resin composition.

The photosensitive resin composition was coated on a PET film to a thickness of 80 μm using a doctor blade, and then, the coated product was dried in an oven of 80° C. for 10 minutes to manufacture a dry film with a thickness of 38 μm.

Example 5

Into 100 parts by weight of the polyamic acid varnish obtained by the method of Preparation Example 6, as a (meth) acrylate compound including a double bond between carbons, 25 parts by weight of A-BPE-10 (Shin Nakamura Chemical), 15 parts by weight of R-115 (Nippon Kayaku) and 3 parts by weight of M300 (Miwon Commercial Co., Ltd.), and as a photopolymerization initiator, 1.2 parts by weight of Darocur TPO were introduced and they were mixed to prepare a photosensitive resin composition.

The photosensitive resin composition was coated on a PET film to a thickness of 80 μm using a doctor blade, and then, the coated product was dried in an oven of 80° C. for 10 minutes to manufacture a dry film with a thickness of 38 μm.

Comparative Example 1

Into 100 parts by weight of the polyamic acid varnish obtained by the method of Preparation Example 3, as a (meth) acrylate compound including a double bond between carbons, 15 parts by weight of A-BPE-20 (Daiichi Chemical) and 15 parts by weight of Kayarad R-128H (Nippon Kayaku), and as a photopolymerization initiator, 1.2 parts by weight of Darocur TPO were introduced and they were mixed to prepare a photosensitive resin composition.

The photosensitive resin composition was coated on a PET film to a thickness of 80 μm using a doctor blade, and then, the coated product was dried in an oven of 80° C. for 10 minutes to manufacture a dry film with a thickness of 38 μm.

Comparative Example 2

Into 100 parts by weight of the polyamic acid varnish obtained by the method of Preparation Example 3, as a (meth) acrylate compound including a double bond between carbons, 20 parts by weight of A-BPE-20 (Daiichi Chemical) and 10 parts by weight of M300 (Miwon Commercial Co., Ltd.), and as a photopolymerization initiator, 1.2 parts by weight of Darocur TPO were introduced and they were mixed to prepare a photosensitive resin composition.

The photosensitive resin composition was coated on a PET film to a thickness of 80 μm using a doctor blade, and then, the coated product was dried in an oven of 80° C. for 10 minutes to manufacture a dry film with a thickness of 38 μm.

Comparative Example 3

Into 100 parts by weight of the polyamic acid varnish obtained by the method of Preparation Example 7, as a (meth) acrylate compound including a double bond between carbons, 30 parts by weight of Ebecryl150 (Cytec) and 13 parts by weight of Ebecryl3708 (Cytec), and as a photopolymerization initiator, 1.2 parts by weight of Darocur TPO were introduced and they were mixed to prepare a photosensitive resin composition.

The photosensitive resin composition was coated on a PET film to a thickness of 80 μm using a doctor blade, and then, the coated product was dried in an oven of 80° C. for 10 minutes to manufacture a dry film with a thickness of 38 μm.

Comparative Example 4

Into 100 parts by weight of the polyamic acid varnish obtained by the method of Preparation Example 8, as a (meth) acrylate compound including a double bond between carbons, 25 parts by weight of A-BPE-10 (Shin Nakamura Chemical), 15 parts by weight of Ebecryl3700 (Cytec) and 3 parts by weight of M300 (Miwon Commercial Co., Ltd.), and as a photopolymerization initiator, 1.2 parts by weight of Darocur TPO were introduced and they were mixed to prepare a photosensitive resin composition.

The photosensitive resin composition was coated on a PET film to a thickness of 80 μm using a doctor blade, and then, the coated product was dried in an oven of 80° C. for 10 minutes to manufacture a dry film with a thickness of 38 μm.

Experimental Example 1

Evaluation of Performances of Dry Films According to Examples and Comparative Examples The dry films manufactured in Examples 1, 2 and Comparative Examples 1, 2 were respectively placed on a 2CCL copper foil, and vacuum was added at 70° C. for 20 seconds using MVLP-500 vacuum laminator (MEIKI Co., Ltd.) to progress vacuum lamination under 0.6 Mpa for 40 seconds. It was UV radiated at the intensity of 400 mJ/cm$^2$, sprayed and developed in a 1 wt % sodium carbonate aqueous solution for 1 minute, and then, cured in an oven of 160° C. under nitrogen atmosphere for 90 minutes. And, properties were evaluated as follows, and the results are described in the following Table 1.

Experimental Example 1-1

Evaluation of Developing Property

The test pieces manufactured in Examples 1, 2 and Comparative Examples 1, 2 were exposed to light at the intensity of 350 mJ/cm$^2$, sprayed and developed with a 1 wt % sodium carbonate aqueous solution of 35° C., and then, it was confirmed whether or not development is possible with a pitch of L/S=50 μm/50 μm. The developing property evaluation results are described in the following Table 1, wherein "○" indicates that development is possible, and "X" indicates that development is not possible.

Experimental Examples 1-2

Evaluation of Resistance to Soldering Heat

In a solder baths of 288±5° C. and 300±5° C., dry films were floated for 10 seconds with the dry film side up, and then, abnormalities of the dry films (delamination or modification of the films) were observed with naked eyes. The results of resistance to soldering heat according to temperatures are described in the following Table 1, wherein "○" indicates that there is no delamination or modification of the films observed with naked eyes in the solder bath at each temperature, and "×" indicates that delamination or modification occurs.

Experimental Example 1-3

Stiffness

The dry films manufactured in Examples and Comparative Examples were vacuum laminated on a FCCL pattern with L/S=1 mm/1 mm (residual rate of copper wiring 5-%), and then, exposed to light, developed and cured. And, it was made to a loop shape with circumference of 10 cm, and when the loop diameter is 2 cm, the power was measured using UTM (universal testing machine) (N/m). The results are described in the following Table 1.

Experimental Example 1-4

Plating Resistance

Electroless nickel/gold plating properties were tested using the dry films manufactured in Examples 1, 2 and Comparative Examples 1, 2, and after electroless nickel/gold plating, liquid penetration or delamination, and the like was observed with naked eyes. The results are described in the following Table 1 wherein "OK" indicates that there is no liquid penetration or delamination observed with naked eyes, after electroless nickel/gold plating, and "NG" indicates that there is liquid penetration or delamination observed with naked eyes.

Experimental Example 1-5

Coefficient of Thermal Expansion

The dry films manufactured in Examples 1, 2 and Comparative Examples 1, 2 were made to a strip shape of 5 mm*20 mm, and then, coefficient of thermal expansion was measured below Tg ($\alpha 1$) and above Tg ($\alpha 2$) using TMA (Thermo-Mechanical Analysis) and the results are described in the following Table 1.

TABLE 1

Evaluation results of Experimental Examples 1-1 to 1-5

| | Developing property | Soldering heat resistance 288° C. | Soldering heat resistance 300° C. | Stiffness (N/m) | Plating resistance | Coefficient of thermal expansion $\alpha 1$ | Coefficient of thermal expansion $\alpha 2$ |
|---|---|---|---|---|---|---|---|
| Example 1 | ○ | ○ | ○ | 3.6 | OK | 90 | 300 |
| Example 2 | ○ | ○ | ○ | 3.8 | OK | 92 | 240 |
| Comparative Example 1 | ○ | ○ | X | 3.5 | NG | 95 | 700 |
| Comparative Example 2 | ○ | ○ | ○ | 6.2 | NG | 78 | 685 |

As shown in the Table 1, dry films prepared using a photosensitive resin composition comprising polyamic acid resin prepared by adding multifunctional aliphatic amine exhibit excellent developing property and soldering heat resistance, and excellent physical properties including plating resistance and high temperature soldering heat resistance. Particularly, as can be seen from the measured thermal expansion coefficient, the test pieces of the dry films of Examples exhibit small numerical change at high temperature.

To the contrary, dry films of Comparative Examples, which are prepared from a photosensitive resin composition comprising common polyamic acid, may exhibit developing property to a certain degree, but exhibit insufficient soldering heat resistance at high temperature. Particularly, if multifunctional (meth)acrylate is used in an excessive amount to increase solder bath heat resistance, high stiffness is exhibited (Comparative Example 2), and plating resistance is not suitable for application as a printed wiring board or circuit board, and the like. Furthermore, dry films of Comparative Examples exhibit large numerical change of thermal expansion coefficient at high temperature, and thus, if applied as a printed wiring board or circuit board, delamination of the dry film layer may occur.

Experimental Example 2

Evaluation of Performances of Dry Films of Examples and Comparative Examples

The dry films manufactured in Examples 3 to 5 and Comparative Examples 3, 4 were placed on 2CCL copper foil having a pattern, vacuum was added at 70° C. for 20 seconds using MVLP-500 laminator (MEIKI) to progress vacuum lamination under 0.7 Mpa for 40 seconds. It was UV radiated at the intensity of 300 mJ/cm$^2$, sprayed and developed in 1 wt % sodium carbonate aqueous solution, and then, cured in an oven of 160° C. under nitrogen atmosphere for 90 minutes. And, the physical properties were evaluated as follows, and the results are described in the following Table 2.

Experimental Example 2-1

Evaluation of Developing Property

The test pieces manufactured in Examples 3 to 5 and Comparative Examples 3, 4 were exposed to light at the intensity of 300 mJ/cm$^2$, sprayed and developed with a 1 wt % sodium carbonate aqueous solution of 30° C., and then, it was confirmed whether or not development is possible with a pitch of L/S=50 μm/50 μm. The developing property evaluation results are described in the following Table 2, wherein "○" indicates that development is possible, and "X" indicates that development is not possible.

Experimental Examples 2-2

Evaluation of Curl

The test pieces were cut into a size of 10 cm*10 cm, and then, placed on a flat plane, and it was observed if curl occurs at the edge. If the edge is lifted to a height of 5 mm or less, it was judged as good, and if the edge is lifted to a height of 5 mm or more, it was judged as poor.

Experimental Examples 2-3

Evaluation of Resistance to Soldering Heat

In a solder baths of 288±5° C., dry films were floated for 10 seconds with the dry film side up, and then, abnormalities of the dry films (delamination or modification of the films) were observed with naked eyes. The results of resistance to soldering heat according to temperatures are described in the following Table 2, wherein "○" indicates that there is no delamination or modification of the films observed with naked eyes in the solder bath at each temperature, and "×" indicates that delamination or modification occurs.

Experimental Example 2-4

Stiffness

The dry films manufactured in Examples 3 to 5 and Comparative Examples 3, 4 were vacuum laminated on a FCCL pattern with L/S=1 mm/1 mm (residual rate of copper wiring 50%), and then, exposed to light, developed and cured. And, it was made to a loop shape with circumference of 10 cm, and when the loop diameter is 2 cm, the power was measured using UTM (universal testing machine) (N/m). The results are described in the following Table 2.

Experimental Example 2-5

Plating Resistance

Electroless nickel/gold plating properties were tested using the dry films manufactured in Examples 3 to 5 and Comparative Examples 3, 4, and after electroless nickel/gold plating, liquid penetration or delamination, and the like was observed with naked eyes. The results are described in the following Table 2 wherein "OK" indicates that there is no liquid penetration or delamination observed with naked eyes, after electroless nickel/gold plating, and "NG" indicates there is liquid penetration or delamination observed with naked eyes.

Experimental Example 2-6

Bending Property

A bending property test pattern of L/S=100 μm/100 μm was fabricated on FCCL, and on the pattern, the dry films manufactured in the Examples and Comparative Examples were vacuum laminated, and then, exposed to light, developed and cured. MIT bending property test was conducted using the sample at φ=0.38 mm, 500 g load, angle 270°, and the results are described in the following Table 2.

Experimental Example 2-7

Ion Migration

The dry films manufactured in the Examples and Comparative Examples were vacuum laminated on an insulation resistance test FCCL coupon of L/S=50 μm/50 μm with a comb shape, and then, exposed to light, developed and cured. A voltage of 5.5V was applied to a HAST chamber maintaining 130° C., 85% RH, and change in resistance was observed for 100 hours. The sample maintaining resistance of 10$^6$Ω or more for 100 hours is indicated by "OK", and the samples wherein resistance drops to 10$^6$Ω or less, or short occurs is indicated by "NG".

TABLE 2

Evaluation results of Experimental Examples 2-1 to 2-7

|  | Example 3 | Example 4 | Example 5 | Comparative Example 3 | Comparative Example 4 |
|---|---|---|---|---|---|
| Developing property | ○ | ○ | ○ | ○ | X |
| Curl | good | good | good | poor | Good |
| Solder bath heat resistance | ○ | ○ | ○ | ○ | X |
| Stiffness (N/m) | 3.7 | 4.0 | 4.2 | 6.8 | 3.5 |
| Plating resistance | OK | OK | OK | NG | NG |
| MIT flexibility | 280 | 300 | 330 | 200 | 380 |
| Ion migration | OK | OK | OK | OK | NG |

As shown in the Table 2, dry films prepared using a photosensitive resin composition (Examples 3 to 5) comprising polyamic acid resin prepared by adding multifunctional aliphatic amine and alkyleneoxide diamine exhibit excellent developing property and soldering heat resistance, and do not show curl at the edge of the films. It is also confirmed that stiffness of the dry films are not so high, flexibility is excellent, and ion migration effect is comparatively excellent.

To the contrary, it is confirmed that in the case of the dry films of Comparative Examples prepared using the photosensitive resin composition of Comparative Examples 3 and 4, a part or most of experimental example items are not suitable for application as a printed wiring board or a circuit board.

What is claimed is:

1. Polyamic acid comprising a repeat unit of the following Chemical Formula 1:

[Chemical Formula 1]

in the Chemical Formula 1, $X_1$ and $X_2$ are identical or different, and independently a tetravalent organic group, $R_1$, $R_2$, $R_3$ and $R_4$ are identical or different, and independently a C1-10 linear or branched alkylene group, $R_5$ is a C1-10 linear or branched alkyl group, x, y and z are independently an integer greater than or equal to 1, and n is an integer greater than or equal to 0.

2. The polyamic acid according to claim 1, wherein in the Chemical Formula 1, $R_1$, $R_2$, $R_3$ and $R_4$ are independently a methylene group, an ethylene group, an n-propylene group, an iso-propylene group, an n-butylene group, an iso-butylene group, an n-pentylene group, an iso-pentylene group or a neo-pentylene group, x, y and z are independently an integer of from 1 to 30, and n is an integer of from 0 to 30.

3. The polyamic acid according to claim 1, comprising a repeat unit of the Chemical Formula 2:

[Chemical Formula 2]

in the Chemical Formula 2, $X_1$ and $X_2$ are identical or different, and independently a tetravalent organic group, and x, y and z are independently an integer of from 1 to 30.

4. The polyamic acid according to claim 1, wherein $X_1$ and $X_2$ are identical or different, and independently a tetravalent organic group selected from the group consisting of the following Chemical Formulae 11 to 24:

[Chemical Formula 11]

[Chemical Formula 12]

in the Chemical Formula 12, $Y_1$ is a single bond, —O—, —CO—, —S—, —SO$_2$—, —C(CH$_3$)$_2$—, —C(CF$_3$)$_2$—, —CONH—, —COO—, —(CH$_2$)$_{n1}$—, —O(CH$_2$)$_{n2}$O—, or —COO(CH$_2$)$_{n3}$OCO—, and n1, n2 and n3 are independently an integer of from 1 to 10,

[Chemical Formula 13]

in the Chemical Formula 13, $Y_2$ and $Y_3$ are identical or different, and independently a single bond, —O—, —CO—, —S—, —SO$_2$—, —C(CH$_3$)$_2$—, —C(CF$_3$)$_2$—, —CONH—, —COO—, —(CH$_2$)$_{n1}$—, —O(CH$_2$)$_{n2}$O—, or —COO(CH$_2$)$_{n3}$OCO—, and n1, n2 and n3 are independently an integer of from 1 to 10,

[Chemical Formula 14]

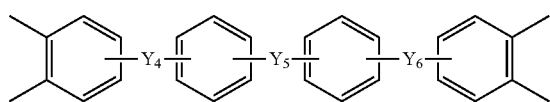

in the Chemical Formula 14, $Y_4$, $Y_5$ and $Y_6$ are identical or different, and independently a single bond, —O—, —CO—, —S—, —SO$_2$—, —C(CH$_3$)$_2$—, —C(CF$_3$)$_2$—, —CONH—, —COO—, —(CH$_2$)$_{n1}$—, —O(CH$_2$)$_{n2}$O—, or —COO(CH$_2$)$_{n3}$OCO—, and n1, n2 and n3 are independently an integer of from 1 to 10,

[Chemical Formula 15]

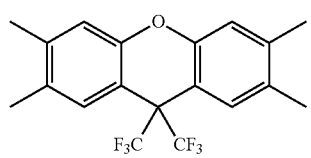

[Chemical Formula 16]

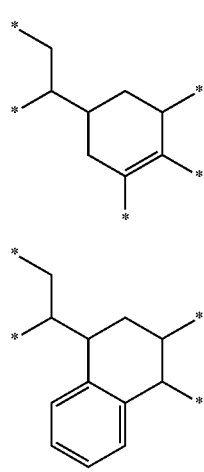

[Chemical Formula 17]

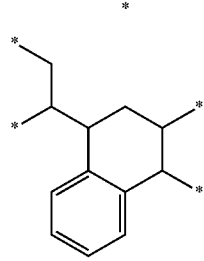

in the Chemical Formula 16 and 17, * is a bonding point,

[Chemical Formula 18]

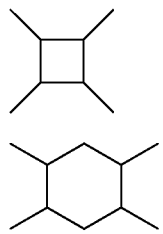

[Chemical Formula 19]

[Chemical Formula 20]

[Chemical Formula 21]

[Chemical Formula 22]

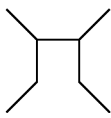

[Chemical Formula 23]

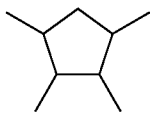

[Chemical Formula 24]

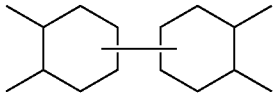

[Chemical Formula 25]

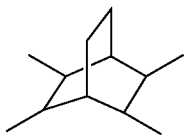

5. The polyamic acid according to claim 1, further comprising a repeat unit of the following Chemical Formula 8:

[Chemical Formula 8]

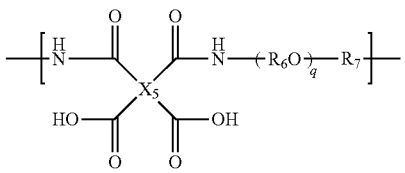

in the Chemical Formula 8,
$X_5$ is a tetravalent organic group, $R_6$ and $R_7$ are identical or different and independently a C1-10 linear or branched alkylene group, and q is an integer greater than equal to 1.

6. The polyamic acid according to claim 5, further comprising a repeat unit of the following Chemical Formula 3:

[Chemical Formula 3]

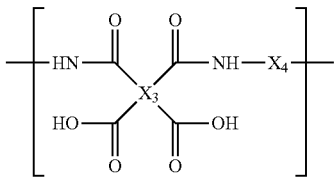

in the Chemical Formula 3,
$X_3$ is a tetravalent organic group, and $X_4$ is a divalent organic group.

7. The polyamic acid according to claim 6, comprising
0.1 to 30 mol % of the repeat unit of the Chemical Formula 1;
2 to 50 mol % of the repeat unit of the Chemical Formula 8; and
20 to 97.9 mol % of the repeat unit of the Chemical Formula 3.

8. The polyamic acid according to claim 1, wherein the polyamic acid has a weight average molecular weight of 5,000 to 200,000.

9. A photosensitive resin composition comprising a polymer resin comprising the polyamic acid of claim 1; a photocrosslinking agent; an organic solvent; and a photopolymerization initiator.

10. The photosensitive composition according to claim 9, wherein the photocrosslinking agent includes a (meth)acrylate-based compound including a double bond between carbons.

11. The photosensitive composition according to claim 9, wherein the photopolymerization initiator includes a compound selected from the group consisting of an acetophenone based compound, a biimidazole based compound, a triazine base compound, and an oxime based compound.

12. The photosensitive composition according to claim 9, wherein the polymer resin has a solid concentration of 20 to 90 wt %, based on the total weight of the photosensitive resin composition.

13. The photosensitive composition according to claim 9, comprising,
based on 100 parts by weight of the polymer resin composition,
5 to 300 parts by weight of the photocrosslinking agent;
100 to 700 parts by weight of the organic solvent; and
0.3 to 10 parts by weight of the photopolymerization initiator.

14. The photosensitive composition according to claim 9, further comprising at least one additives selected from the group consisting of a thermal crosslinking agent, a curing accelerator, a photocrosslinking sensitizer, a phosphorus flame retardant, an antifoaming agent, a leveling agent, and an antigelling agent.

15. A dry film comprising a cured product of the photosensitive resin composition of claim 9.

16. The dry film according to claim 15, wherein the dry film is used for a protection film for a circuit board, a base film for a circuit board, an insulating layer of a circuit board, a semiconductor interlayer dielectric, or a solder resist.

17. A circuit board comprising the dry film of claim 15.

18. The circuit board according to claim 17, wherein the circuit board is a multi-layer printed-circuit board, a flexible circuit board, or a ductile circuit board.

* * * * *